(12) United States Patent
Takenaga et al.

(10) Patent No.: US 9,259,761 B2
(45) Date of Patent: Feb. 16, 2016

(54) HEAT TREATMENT SYSTEM, HEAT TREATMENT METHOD, AND NON-TRANSITORY COMPUTER-READABLE RECORDING MEDIUM

(71) Applicant: TOKYO ELECTRON LIMITED, Tokyo (JP)

(72) Inventors: Yuichi Takenaga, Oshu (JP); Wenling Wang, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 397 days.

(21) Appl. No.: 13/852,235

(22) Filed: Mar. 28, 2013

(65) Prior Publication Data

US 2013/0260039 A1 Oct. 3, 2013

(30) Foreign Application Priority Data

Mar. 29, 2012 (JP) .................................. 2012-077869

(51) Int. Cl.
- *G06F 19/00* (2011.01)
- *B05D 3/02* (2006.01)
- *B05C 9/14* (2006.01)
- *H01L 21/324* (2006.01)

(52) U.S. Cl.
CPC ................ *B05D 3/0218* (2013.01); *B05C 9/14* (2013.01); *H01L 21/324* (2013.01)

(58) Field of Classification Search
CPC ....... B05D 3/0218; H01L 21/324; B05C 9/14
USPC ........................................................ 700/121
See application file for complete search history.

(56) References Cited

U.S. PATENT DOCUMENTS

| | | | | | |
|---|---|---|---|---|---|
| 5,372,958 | A | * | 12/1994 | Miyasaka | ............ H01L 21/3003 148/DIG. 150 |
| 5,895,596 | A | * | 4/1999 | Stoddard | .................. C23C 16/52 118/725 |
| 5,991,525 | A | | 11/1999 | Shah et al. | |

(Continued)

FOREIGN PATENT DOCUMENTS

JP          2005-183596 A          7/2005

OTHER PUBLICATIONS

Norman, S.A.; Boyd, Stephen P., "Multivariable Feedback Control of Semiconductor Wafer Temperature," in American Control Conference, 1992, vol., No., pp. 811-816, Jun. 24-26, 1992.*

(Continued)

*Primary Examiner* — Michael D Masinick
(74) *Attorney, Agent, or Firm* — Nath Goldberg & Meyer; Jerald L. Meyer

(57) ABSTRACT

According to an embodiment of the present invention, a heat treatment system is provided. The heat treatment system includes a heating unit, a heat treatment condition memory unit, a power change model memory unit, a heat treatment change model memory unit, a heat treatment result reception unit, and an optimal temperature calculation unit. In the heat treatment system, the optimal temperature calculation unit calculates the power of the heating unit at a corresponding temperature based on the model stored in the power change model memory unit and the calculated temperature, and an optimal temperature is a temperature at which a heat treatment result is closest to the targeted heat treatment result within a range in which the calculated power of the heating unit is not saturated.

3 Claims, 12 Drawing Sheets

(56) References Cited

U.S. PATENT DOCUMENTS

| | | | | |
|---|---|---|---|---|
| 6,492,625 | B1* | 12/2002 | Boguslavskiy | C23C 16/46 118/725 |
| 6,627,860 | B1* | 9/2003 | Robertson | G01K 15/00 219/497 |
| 7,006,900 | B2* | 2/2006 | Zhenduo | G05B 11/42 165/289 |
| 7,087,443 | B2* | 8/2006 | Hornberg | H01L 21/324 219/483 |
| 2005/0192681 | A1* | 9/2005 | Matsunaga | G05B 5/01 700/29 |
| 2005/0240288 | A1* | 10/2005 | Tanaka | G05B 11/42 700/19 |
| 2008/0280451 | A1* | 11/2008 | Ohmoto | H01L 21/67109 438/710 |
| 2011/0008955 | A1* | 1/2011 | Horii | C23C 16/40 438/608 |
| 2011/0059621 | A1* | 3/2011 | Yoshida | G05D 23/1928 438/795 |
| 2013/0256293 | A1* | 10/2013 | Takenaga | H01L 21/67098 219/413 |
| 2013/0260039 | A1* | 10/2013 | Takenaga | B05D 3/0218 427/314 |

OTHER PUBLICATIONS

Jana, Atanu, and Jayati Datta. "Enhancement of photo-characteristics of $Bi_2Se_3$ thin films by post heat treatment at optimal temperature range." Journal of Electroanalytical Chemistry 689 (2013): 31-41.*

Ahamat, M. A., and M. J. Tierney. "Timewise temperature control with heat metering using a thermoelectric module." Applied Thermal Engineering 31.8 (2011): 1421-1426.*

* cited by examiner

FIG. 4

| FILM THICKNESS (nm) | TEMPERATURE(INCREASED BY ONE DEGREE C) | | | | |
| --- | --- | --- | --- | --- | --- |
| | ZONE1 | ZONE2 | ZONE3 | ZONE4 | ZONE5 |
| ZONE1 | 2.00 | −0.70 | 0.80 | −0.04 | 0.00 |
| ZONE2 | −0.70 | 2.00 | −0.70 | 0.70 | 0.02 |
| ZONE3 | 0.80 | −0.70 | 2.00 | −0.70 | 0.70 |
| ZONE4 | −0.05 | 0.80 | −0.70 | 2.00 | −0.70 |
| ZONE5 | 0.00 | −0.05 | 0.80 | −0.70 | 2.00 |

FIG. 5

| POWER (%/°C) | TEMPERATURE(INCREASED BY ONE DEGREE C) | | | | |
|---|---|---|---|---|---|
| | ZONE1 | ZONE2 | ZONE3 | ZONE4 | ZONE5 |
| ZONE1 | 1.00 | −0.70 | 0.01 | −0.04 | 0.03 |
| ZONE2 | −0.70 | 1.00 | −0.70 | 0.00 | 0.00 |
| ZONE3 | 0.06 | −0.70 | 1.00 | −0.70 | 0.02 |
| ZONE4 | −0.01 | 0.04 | −0.70 | 1.00 | −0.70 |
| ZONE5 | 0.02 | −0.01 | 0.04 | −0.70 | 1.00 |

FIG. 7

|  | TARGET FILM THICKNESS (nm) |
|---|---|
| ZONE1 | 100.00 |
| ZONE2 | 100.00 |
| ZONE3 | 100.00 |
| ZONE4 | 100.00 |
| ZONE5 | 100.00 |

FIG. 8A

|  | TEMPERATURE (°C) |
|---|---|
| ZONE1 | 580.0 |
| ZONE2 | 580.0 |
| ZONE3 | 580.0 |
| ZONE4 | 580.0 |
| ZONE5 | 580.0 |

FIG. 8B

|  | POWER (%) |
|---|---|
| ZONE1 | 15.0 |
| ZONE2 | 10.0 |
| ZONE3 | 5.0 |
| ZONE4 | 2.0 |
| ZONE5 | 0.8 |

FIG. 9

|  | FILM THICKNESS (nm) |
|---|---|
| ZONE1 | 96.00 |
| ZONE2 | 98.00 |
| ZONE3 | 100.00 |
| ZONE4 | 98.00 |
| ZONE5 | 97.00 |

FIG. 10A

|  | TEMPERATURE (°C) |
|---|---|
| ZONE1 | 581.4 |
| ZONE2 | 580.7 |
| ZONE3 | 579.9 |
| ZONE4 | 581.1 |
| ZONE5 | 579.0 |

FIG. 10B

| | ΔT (℃) |
|---|---|
| ZONE1 | 1.4 |
| ZONE2 | 0.7 |
| ZONE3 | −0.1 |
| ZONE4 | 1.1 |
| ZONE5 | −1.0 |

FIG. 10C

| | POWER (%) |
|---|---|
| ZONE1 | 15.0 |
| ZONE2 | 10.0 |
| ZONE3 | 4.5 |
| ZONE4 | 2.6 |
| ZONE5 | −4.5 |

FIG. 11A

|  | TEMPERATURE (°C) |
|---|---|
| ZONE1 | 581.4 |
| ZONE2 | 580.4 |
| ZONE3 | 580.4 |
| ZONE4 | 580.6 |
| ZONE5 | 576.8 |

FIG. 11B

|  | POWER (%) |
|---|---|
| ZONE1 | 15.4 |
| ZONE2 | 9.8 |
| ZONE3 | 5.0 |
| ZONE4 | 2.8 |
| ZONE5 | 0.1 |

FIG. 12

|  | FILM THICKNESS (nm) |
|---|---|
| ZONE1 | 100.2 |
| ZONE2 | 99.5 |
| ZONE3 | 100.6 |
| ZONE4 | 99.7 |
| ZONE5 | 100.1 |

HEAT TREATMENT SYSTEM, HEAT TREATMENT METHOD, AND NON-TRANSITORY COMPUTER-READABLE RECORDING MEDIUM

CROSS-REFERENCE TO RELATED APPLICATION

This application claims the benefit of Japanese Patent Application No. 2012-077869, filed on Mar. 29, 2012, in the Japan Patent Office, the disclosure of which is incorporated herein in its entirety by reference.

TECHNICAL FIELD

The present disclosure relates to a batch type heat treatment system which batch-processes a plurality of objects to be processed such as a semiconductor wafer, a heat treatment method for heat-treating the objects to be processed, and a non-transitory computer-readable recording medium thereof.

BACKGROUND

A process of manufacturing a semiconductor device uses a batch type heat treatment system that batch-performs film formation processing, oxidation treatment, or diffusion treatment of a plurality of objects to be processed, for example, a plurality of semiconductor wafers. In the batch type heat treatment system, although it is possible to efficiently process a semiconductor wafer, it is difficult to uniformly heat-treat the plurality of semiconductor wafers.

To secure the uniformity on heat treatment of the semiconductor wafers, a heat treatment apparatus that automatically regulates an outdoor temperature was proposed. Such heat treatment apparatus controls the outdoor temperature introduced into a heater to become constant.

However, in a heater used to regulate a temperature, power of the heater and power of a heater disposed in an adjacent zone cause interference to each other, and thus, the power of the heater is increased or decreased by the power of the heater disposed in the adjacent zone. Also, recent energy saving heaters are very low in power output compared to conventional heaters, and thus, even when a temperature is slightly regulated, power of the recent energy saving heater can be saturated (0% or 100%). If power of a heater is saturated, it is unable to accurately control a temperature, causing a reduction in reproducibility of heat treatment. For this reason, in regulating a temperature of a heater, it is required to set the temperature in consideration of power of the heater.

As described above, since it becomes difficult to regulate a temperature of a heater, a manipulator of a heat treatment system performs fine regulation on the basis of an experience or a sense, and thus, a heat treatment system and a heat treatment method are needed in which even a manipulator, having no knowledge or experience of a heat treatment system or a process, can easily regulate a temperature without saturating power of a heater.

SUMMARY

The present disclosure provides to a heat treatment system, a heat treatment method, and a non-transitory computer-readable recording medium which enable the easy regulation of a temperature.

According to one embodiment of the present disclosure, a heat treatment system is provided. The heat treatment system includes a heating unit configured to heat an inside of a processing chamber which receives a plurality of objects to be processed, and a heat treatment condition memory unit configured to store a heat treatment condition based on processing details, wherein the heat treatment condition includes a temperature inside the processing chamber heated by the heating unit. The heat treatment system further includes a power change model memory unit configured to store a model showing a relationship between a temperature change inside the processing chamber and a power change of the heating unit, and a heat treatment change model memory unit configured to store a heat treatment change model showing a relationship between the temperature change inside the processing chamber and a change of a heat treatment result. Also, The heat treatment system includes a heat treatment result reception unit configured to receive information on a heat treatment result in the heat treatment condition stored by the heat treatment condition memory unit and a targeted heat treatment result, and an optimal temperature calculation unit configured to calculate an optimal temperature corresponding to the targeted heat treatment result based on the heat treatment result in the heat treatment condition and the heat treatment change model stored in the heat treatment change model memory unit. In this heat treatment system, the heat treatment result is received by the heat treatment result reception unit, wherein the optimal temperature calculation unit calculates power of the heating unit at a corresponding temperature on the basis of the model stored in the power change model memory unit and the calculated temperature, and an optimal temperature is a temperature at which a heat treatment result is closest to the targeted heat treatment result within a range in which the calculated power of the heating unit is not saturated.

According to another embodiment of the present disclosure, a heat treatment method comprising is provided. The heat treatment method includes storing a heat treatment condition based on processing details, wherein the heat treatment condition includes a temperature inside a processing chamber heated by a heating unit that heats an inside of the processing chamber which receives a plurality of objects to be processed. Further, the heat treatment methods includes storing a power change model showing a relationship between a temperature change inside the processing chamber and a power change of the heating unit, and storing a heat treatment change model showing a relationship between the temperature change inside the processing chamber and a change of a heat treatment result. The heat treatment methods also includes receiving a heat treatment result which is information on the heat treatment result in the heat treatment condition stored by the storing of the heat treatment condition and a targeted heat treatment result, and calculating an optimal temperature corresponding to the targeted heat treatment result, on the basis of the heat treatment result in the heat treatment condition and the heat treatment change model stored by the storing of the heat treatment change model. In the heat treatment methods, the heat treatment result is received by the receiving of the heat treatment result, and the calculating of an optimal temperature calculates power of the heating unit at a corresponding temperature on the basis of the model stored by the storing of the power change model and the calculated temperature, and an optimal temperature is a temperature at which a heat treatment result is closest to the targeted heat treatment result within a range in which the calculated power of the heating unit is not saturated.

According to another embodiment of the present disclosure, a non-transitory computer-readable recording medium that causes a computer to perform as a heat treatment condition memory unit configured to store a heat treatment condition based on processing details, wherein the heat treatment condition includes a temperature inside a processing chamber heated by a heating unit that heats an inside of the processing chamber which receives a plurality of objects to be processed. Further, the non-transitory computer-readable recording medium comprising instructions causing a computer to perform as a power change model memory unit configured to store a model showing a relationship between a temperature change inside the processing chamber and a power change of the heating unit, a heat treatment change model memory unit configured to store a heat treatment change model showing a relationship between the temperature change inside the processing chamber and a change of a heat treatment result, a heat treatment result reception unit configured to receive information on a heat treatment result in the heat treatment condition stored by the heat treatment condition memory unit and a targeted heat treatment result, and an optimal temperature calculation unit configured to calculate an optimal temperature corresponding to the targeted heat treatment result based on the heat treatment result in the heat treatment condition and the heat treatment change model stored in the heat treatment change model memory unit. In the non-transitory computer-readable recording medium, the heat treatment result is received by the heat treatment result reception unit, wherein the optimal temperature calculation unit calculates power of the heating unit at a corresponding temperature on the basis of the model stored in the power change model memory unit and the calculated temperature, and an optimal temperature is a temperature at which a heat treatment result is closest to the targeted heat treatment result within a range in which the calculated power of the heating unit is not saturated.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is an example of a film-thickness change model showing a relationship between a temperature change of a heater and a film-thickness change of a formed $SiO_2$ film.

FIG. 5 is an example of a power change model showing a relationship between a temperature change and a power change of a heater.

FIG. 7 is a diagram showing target film thicknesses input by a manipulator.

FIGS. 8A and 8B are diagrams respectively showing temperatures recorded in a recipe and powers of respective heaters at the temperatures.

FIG. 9 is a diagram showing film thicknesses of $SiO_2$ films.

FIGS. 10A to 10C are diagrams for describing the optimal temperatures.

FIGS. 11A and 11B are diagrams respectively showing the optimal temperatures and powers of the respective heaters at the optimal temperatures.

FIG. 12 is a diagram showing film thicknesses after regulation of the $SiO_2$ films.

DETAILED DESCRIPTION

Hereinafter, as an example, an embodiment of the present disclosure will be described using a case in which a heat treatment system, a heat treatment method, and a program of the present disclosure are applied to a batch type vertical heat treatment apparatus illustrated in FIG. 1. Also, in an embodiment of the present disclosure, a $SiO_2$ film is formed on a semiconductor wafer by using film-forming gases such as dichlorosilane ($SiH_2Cl_2$) and dinitrogen monoxide ($N_2O$), as an example.

Figure 1:
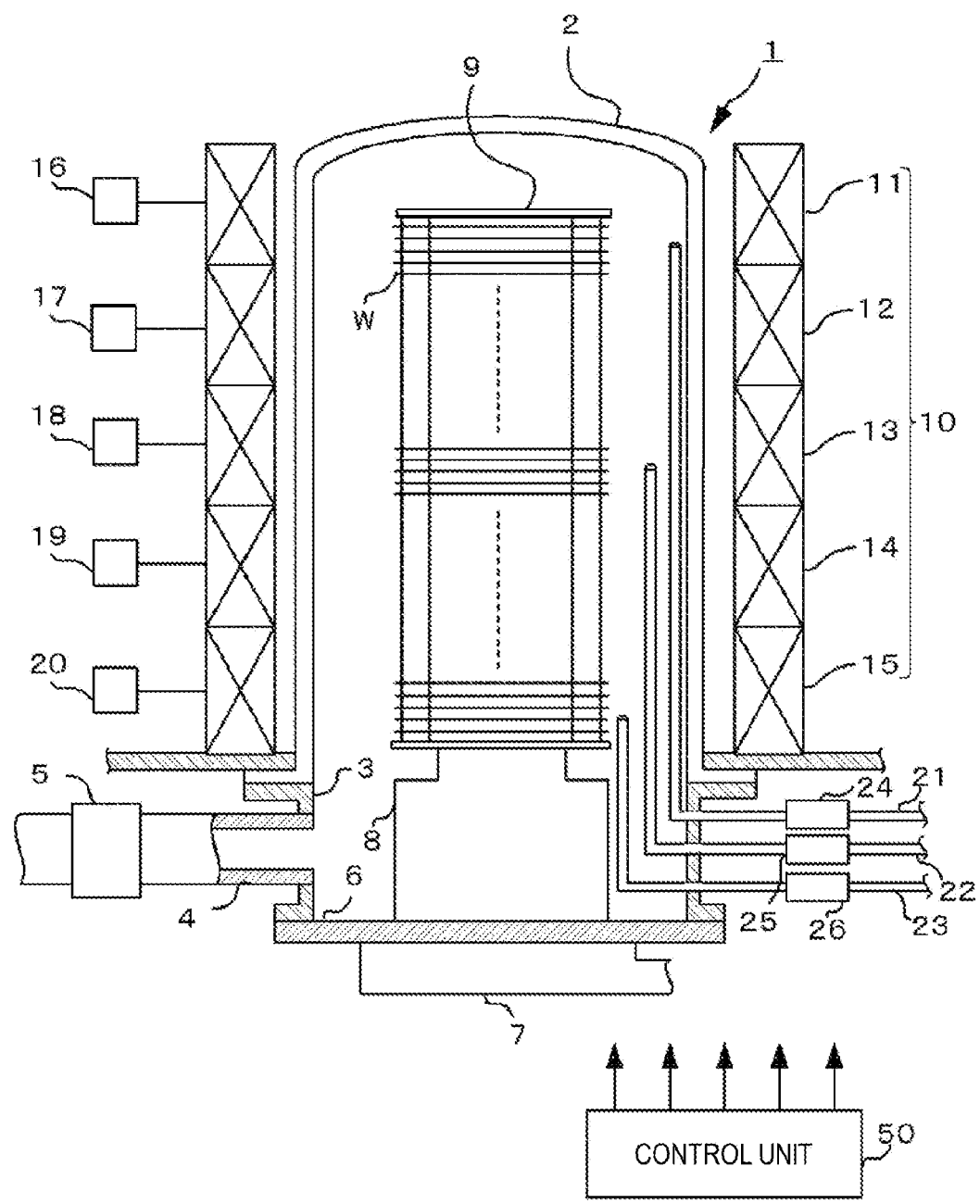
FIG. 1 is a diagram illustrating a structure of a heat treatment apparatus according to an embodiment of the present disclosure.

As illustrated in FIG. 1, a heat treatment apparatus 1 according to the embodiment includes a reaction tube 2 which is approximately cylindrical in shape and has a ceiling. The reaction tube 2 is disposed such that a length direction of the reaction tube 2 is positioned in a vertical direction. The reaction tube 2 may be formed of a material (for example, quartz) having excellent heat resistance and corrosion resistance.

A manifold 3 having an approximately cylindrical shape is disposed at a lower side of the reaction tube 2. The manifold 3 is joined to a lower end portion of the reaction tube 2 at an upper end portion of the manifold 3. An exhaust pipe 4 for exhausting gas inside the reaction tube 2 is connected to the manifold 3. A pressure regulation unit 5 including a valve and a vacuum pump is installed in the exhaust pipe 4, thereby regulating the inside of the reaction tube 2 to be at a desired pressure (a degree of vacuum).

A cover 6 is disposed under the manifold 3 connected to the reaction tube 2. The cover 6 is configured to be vertically movable by a boat elevator 7. In other words, when the boat elevator 7 vertically moves the cover 6 up, a lower side (a furnace opening portion) of the manifold 3 connected to the reaction tube 2 is closed. On the other hand, when the boat elevator 7 vertically moves the cover 6 down, a lower side (furnace opening portion) of the manifold 3 connected to the reaction tube 2 is opened.

A wafer boat 9 is installed on a heat-insulating tube (heat insulator) 8, over the cover 6. The wafer boat 9 is a wafer holding instrument that receives (holds) an object to be processed, for example, a semiconductor wafer W. In the embodiment, the wafer boat 9 is configured to receive a plurality of semiconductor wafers W (for example, 150 semiconductor wafers) in a vertical direction at certain intervals. Once, the semiconductor wafer W is placed in the wafer boat 9, the semiconductor wafer W is loaded into the reaction tube 2 by the boat elevator 7, which vertically moves the cover 6 upward.

Figure 3:
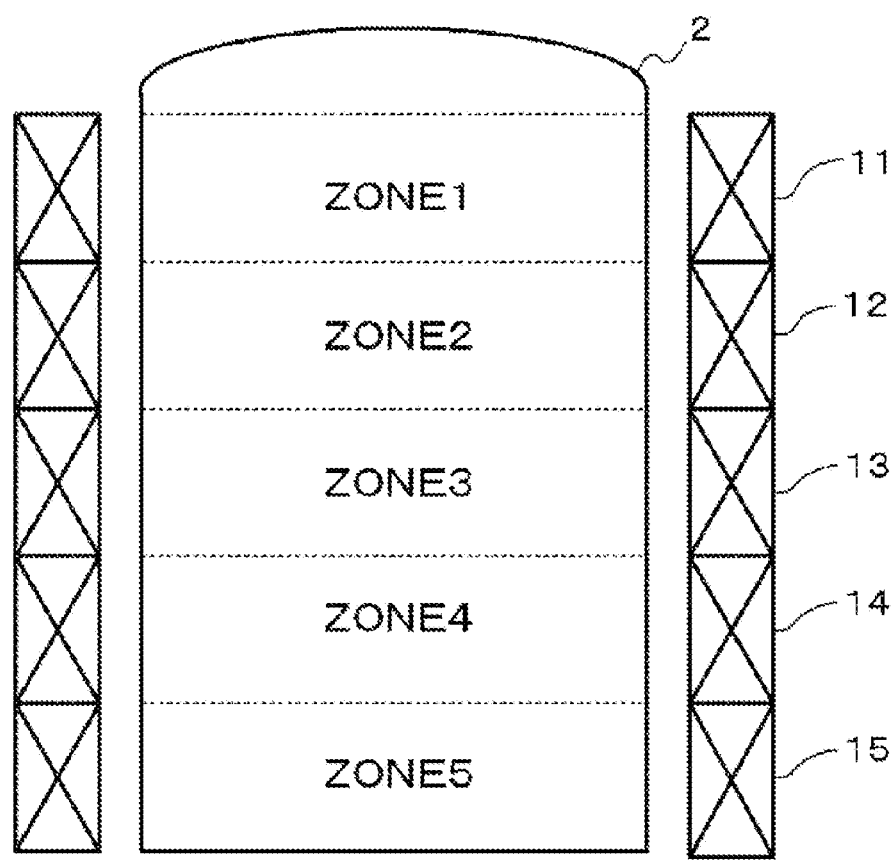
FIG. 3 is a diagram illustrating zones inside a reaction tube.

A heater part 10 may be configured with a resistance heating element. The heater part 10 is disposed around the reaction tube 2 to surround the reaction tube 2. The inside of the reaction tube 2 is heated to a predetermined temperature by the heater part 10, and thus, the semiconductor wafer W is heated to a predetermined temperature. The heater part 10, for example, is configured with a plurality of heaters 11 to 15, where the heaters 11 to 15 represent five different stages, and a plurality of power controllers 16 to 20 are respectively connected to the heaters 11 to 15. Therefore, by independently supplying power to the power controllers 16 to 20, the heaters 11 to 15 may independently heated to a desired temperature. For example, as illustrated in FIG. 3, the inside of the reaction tube 2 is divided into five zones by the heaters 11 to 15. In this case, when a top (ZONE 1) of the reaction tube 2 is to be heated, the heater 11 is heated to a desired temperature by controlling the power controller 16. When a center

[CTR (ZONE 3)] of the reaction tube 2 is to be heated, the heater 13 is heated to a desired temperature by controlling the power controller 18. When a bottom [BTM (ZONE 5)] of the reaction tube 2 is to be heated, the heater 15 is heated to a desired temperature by controlling the power controller 20.

Moreover, a plurality of processing gas supply pipes for supplying processing gas into the reaction tube 2 may be disposed in the manifold 3. For example, in FIG. 1, three processing gas supply pipes 21 to 23 for supplying the processing gas into the manifold 3 are illustrated. The processing gas supply pipe 21 is provided to be extended from a side of the manifold 3 to near an upper portion of the wafer boat 9 (ZONE 1). The processing gas supply pipe 22 is provided to be extended from the side of the manifold 3 to near a center of the wafer boat 9 (ZONE 3). The processing gas supply pipe 23 is provided to be extended from the side of the manifold 3 to near a lower portion of the wafer boat 9 (ZONE 5).

A plurality of flow rate regulation units 24 to 26 are respectively disposed in the processing gas supply pipes 21 to 23. Each of the flow rate regulation units 24 to 26 is configured with a mass flow controller (MFC) for regulating a flow rate of the processing gas flowing in the processing gas supply pipes 21 to 23. Therefore, respective processing gases supplied from the processing gas supply pipes 21 to 23 are regulated to a desired flow rate by the flow rate regulation units 24 to 26, and supplied into the reaction tube 2.

Figure 2:
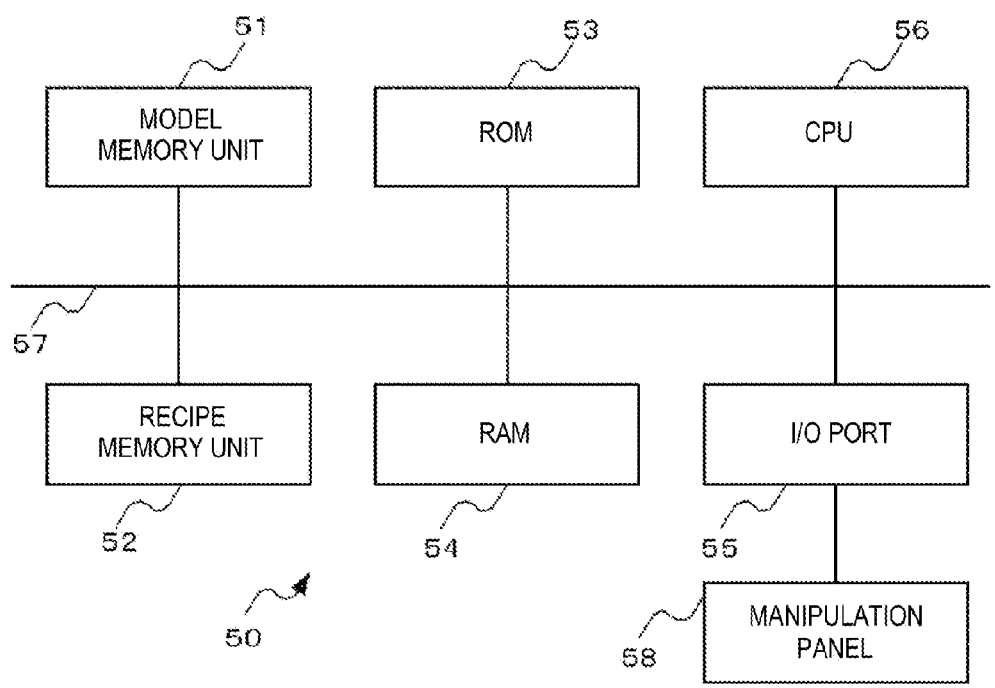
FIG. 2 is a diagram illustrating a configuration example of a control unit of FIG. 1.

Moreover, the heat treatment apparatus 1 includes a control unit (controller) 50 for controlling a plurality of processing parameters such as a gas flow rate, a pressure, a processing-atmosphere temperature inside the reaction tube 2. The control unit 50 outputs respective control signals to the flow rate regulation units 24 to 26, the pressure regulation unit 5, and the power controllers 16 to 20 for the respective heaters 11 to 15. FIG. 2 illustrates a configuration of the control unit 50.

As illustrated in FIG. 2, the control unit 50 includes a model memory unit 51, a recipe memory unit 52, a read-only memory (ROM) 53, a random access memory (RAM) 54, an input/output (I/O) port 55, a central processing unit (CPU) 56, and a bus connecting those elements.

The model memory unit 51 stores a film-thickness change model showing a relationship between a temperature change of a heater and a film-thickness change of a formed $SiO_2$ film. Also, the model memory unit 51 stores a power change model showing a relationship between a temperature change and a power change of a heater. Also, details of the models will be described later.

The recipe memory unit 52 stores a recipe for a process for determining a control sequence based on the type of a film formation processing executed by the heat treatment apparatus 1. The recipe for the process is prepared for each processing (process) which is actually performed by a user, and regulates a temperature change of each element, a pressure change inside the reaction tube 2, timings for the start and stop of the gas supply, and the amount of the supplied gas from the loading of the semiconductor wafer W into the reaction tube 2 to the unloading of a processed semiconductor wafer W.

The ROM 53 is a recoding medium which is configured with an electrically erasable programmable read-only memory (EEPROM), a flash memory, a hard disk, or the like, and stores an operation program of the CPU 56. The RAM 54 acts as a work area of the CPU 56.

The I/O port 55 simultaneously supplies measurement signals of a temperature, a pressure, and a flow rate of a gas to the CPU 56, and outputs the control signals from the CPU 56 to the respective elements such as the pressure regulation unit 5, the power controllers 16 to 20 for their respective heaters 11 to 15, and the flow rate regulation units 24 to 26. Also, a manipulation panel 58 enabling a manipulator to manipulate the heat treatment apparatus 1 is connected to the I/O port 55.

The CPU 56 configures a central element of the control unit 50, executes the operation program stored in the ROM 53, and controls an operation of the heat treatment apparatus 1 based on the recipe for the process stored in the recipe memory unit 52 according to an instruction from the manipulation panel 58.

The CPU 56 calculates the setting temperatures of the respective heaters 11 to 15 disposed in ZONEs 1 to 5 (in which a target film thickness is formed) inside the reaction tube 2, based on the film-thickness change model stored in the model memory unit 51 and the actual film thicknesses of the formed $SiO_2$ films. Also, the CPU 56 calculates powers of the heaters 11 to 15 at the respective setting temperatures, based on the power change model stored in the model memory unit 51 and the calculated setting temperatures of the heaters 11 to 15. In calculating the setting temperatures of the heaters 11 to 15, the CPU 56 determines whether the powers of the heaters 11 to 15 at the respective setting temperatures are saturated (0% or 100%), and calculates a temperature (optimal temperature) at which a film thickness is closest to the target film thickness within a range in which the power is not saturated. The bus 57 transfers information between the elements.

Next, the models stored in the model memory unit 51 will be described. As described above, the model memory unit 51 stores the film-thickness change model showing a relationship between a temperature change of a heater and a film-thickness change of a formed $SiO_2$ film.

Generally, when a temperature inside the reaction tube 2 is increased, a film thickness of a formed $SiO_2$ is also increased. Also, when a temperature of one receiving position (ZONE) inside the reaction tube 2 is changed, a film thickness of a $SiO_2$ film formed on a semiconductor wafer W in the ZONE is affected by the changed temperature, and moreover, a film thickness of a $SiO_2$ film formed on a semiconductor wafer W in a different ZONE is also affected by the changed temperature. An example of the film-thickness change model is shown in FIG. 4.

As shown in FIG. 4, the film-thickness change model shows degrees by which the film thicknesses of the $SiO_2$ films formed in the respective ZONEs are changed when a temperature of a specific ZONE is increased by one degree C. For example, FIG. 4 illustrates that a temperature setting value of the ZONE 1 is increased by one degree C. by controlling the power controller 16 to heat the heater 11. In this case, a portion indicated by broken lines in FIG. 4 shows that a film thickness of a $SiO_2$ film formed in the ZONE 1 is increased by 2 nm, a film thickness of a $SiO_2$ film formed in the ZONE 2 is decreased by 0.7 nm, a film thickness of a $SiO_2$ film formed in the ZONE 3 is increased by 0.8 nm, and a film thickness of a $SiO_2$ film formed in the ZONE 4 is decreased by 0.05 nm.

Moreover, the film-thickness change model may use various models showing degrees by which the film thicknesses of the $SiO_2$ films formed in the respective ZONEs are respectively changed when a temperature of a specific ZONE is changed.

Moreover, the model memory unit 51 stores the power change model showing a relationship between a temperature change and a power change of a heater.

Generally, when a temperature of one receiving position (ZONE) inside the reaction tube 2 is changed, the power of a heater disposed in the ZONE is affected by the changed temperature, and moreover, the power of a heater disposed in a different ZONE is affected by the changed temperature. An example of the power change model is shown in FIG. 5.

As shown in FIG. 5, the power change model shows degrees by which powers of heaters disposed in the respective ZONEs are respectively changed when a temperature of a specific ZONE is increased by one degree C.

For example, FIG. 5 illustrates that a temperature setting value of the heater 11 in the ZONE 1 is increased by one degree C. by controlling the power controller 16. In this case, a portion indicated by broken lines in FIG. 5 shows that the power of the heater 11 in the ZONE 1 is increased by 1.00%, the power of the heater 12 in the ZONE 2 is decreased by 0.70%, the power of the heater 13 in the ZONE 3 is increased by 0.06%, the power of the heater 14 in the ZONE 4 is decreased by 0.01%, and the power of the heater 15 in the ZONE 5 is increased by 0.02%.

Moreover, the power change model may use various models showing degrees by which powers of the heaters disposed in the respective ZONEs are respectively changed when a temperature of a heater disposed in a specific ZONE is changed.

Moreover, since even a case in which a default value is not optimal depending on a process condition or a device state can be considered, the model may use a model in which model learning is performed by adding an extended Kalman filter or the like to software to provide a learning function. The learning function based on the Kalman filter, for example, may use a method disclosed in U.S. Pat. No. 5,991,525.

Figure 6:
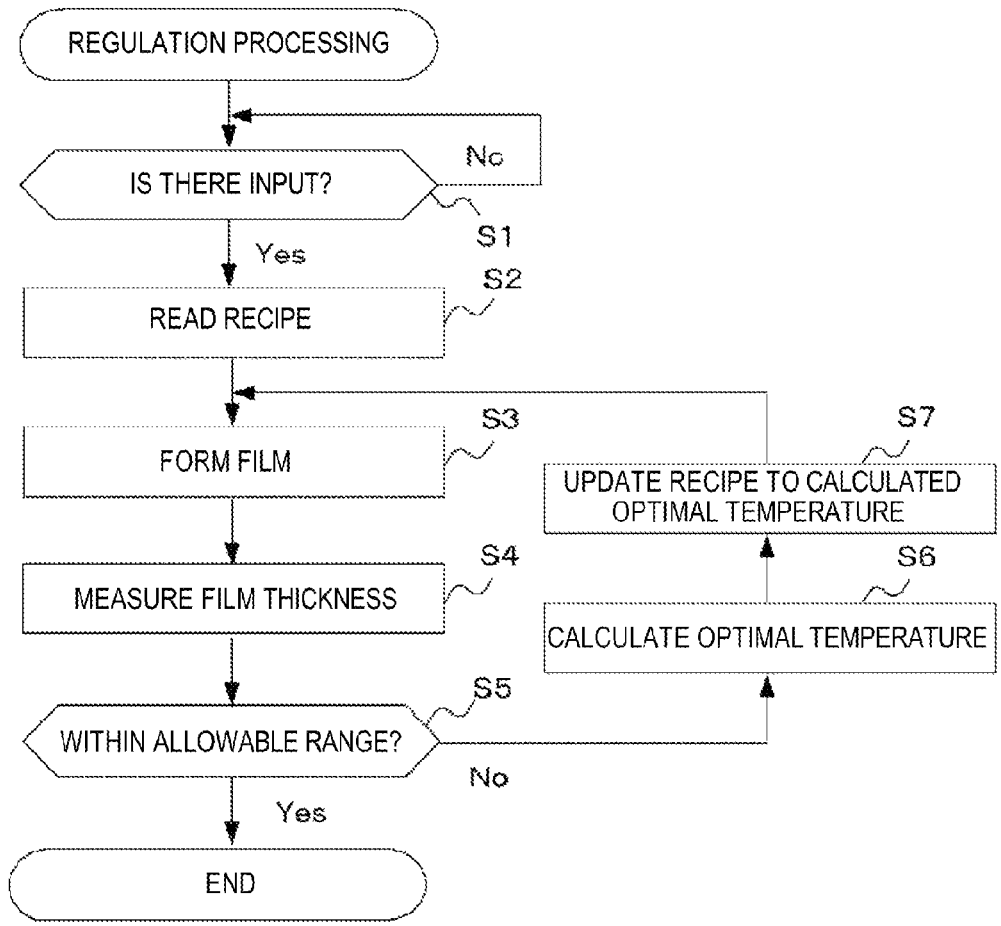
FIG. 6 is a flowchart for describing regulation processing.

The following description will be made on a regulation method (regulation processing) that regulates a temperature inside the reaction tube 2 (each of the ZONEs 1 to 5) by using the heat treatment apparatus 1 having the above-described configuration. The regulation processing is to calculate a temperature (optimal temperature) at which a film thickness is closest to the target film thickness within a range in which the power is not saturated. Also, the regulation processing may be performed in a setup operation before the film formation processing, and the regulation processing may be performed simultaneously with the film formation processing. FIG. 6 is a flowchart for describing the regulation processing of this embodiment.

In the regulation processing, by manipulating the manipulation panel 58, the manipulator selects a process classification such as a formed film (DCS-HTO) of a $SiO_2$ film of dichlorosilane ($SiH_2Cl_2$) and dinitrogen monoxide ($N_2O$), and simultaneously, as shown in FIG. 7, the manipulator inputs a target film thickness of the $SiO_2$ film for each zone.

The control unit 50 including CPU 56 determines whether the process classification or the like is input, in operation S1. When it is determined that necessary information is input (operation S1; YES) for a process, the CPU 56 reads a recipe for the process, corresponding to the input process classification, from the recipe memory unit 52, in operation S2. Process conditions such as a pressure, a temperature inside the reaction tube 2 are recorded in the recipe. For example, as shown in FIG. 8A, temperatures of the ZONEs 1 to 5 inside the reaction tube 2 are recorded in the recipe. Also, as shown in FIG. 8B, the CPU 56 calculates the powers of the heaters 11 to 15 from the recorded temperatures of the ZONEs 1 to 5.

Subsequently, the CPU 56 controls the boat elevator 7 and the cover 6 to vertically move downwards, and to dispose the wafer boat 9, on which semiconductor wafers W are at least mounted in the respective ZONEs 1 to 5, on the cover 6. Subsequently, the CPU 56 controls the boat elevator 7 and the cover 6 to vertically move upwards, and loads the wafer boat 9 carrying the semiconductor wafer W into the reaction tube 2. Furthermore, the CPU 56 controls the pressure regulation unit 5, the power controllers 16 to 20 for the respective heaters 11 to 15, and the flow rate regulation units 24 to 26 according to the recipe read from the recipe memory unit 52, thereby forming the $SiO_2$ film on the semiconductor wafer W in operation S3.

When the film formation processing is finished, the CPU 56 measures a film thickness of the formed $SiO_2$ film, in operation S4. For example, the CPU 56 controls the boat elevator 7 and the cover 6 to vertically move downwards to unload the semiconductor wafer W with the $SiO_2$ film formed thereon. Further, the unloaded semiconductor wafer W is transferred to, for example, a measurement apparatus (not shown), which is configured to measure a film thickness of the $SiO_2$ film formed on the semiconductor wafer W. The measurement apparatus measures the film thickness of the $SiO_2$ film formed on each monitor wafer, and, for example, the measurement apparatus transfers data of the measured film thickness (shown in FIG. 9) of the $SiO_2$ film to the CPU 56 of the heat treatment apparatus 1. When the CPU 56 receives the data of the measured film thickness of the $SiO_2$ film, the CPU 56 specifies the film thickness of the formed $SiO_2$ film. Also, the manipulator may manipulate the manipulation panel 58 to input a measurement result.

When the film thickness of the formed $SiO_2$ film has been measured, the CPU 56 determines whether the measured film thickness is within an allowable range, in operation S5. Here, the measured film thickness being within the allowable range denotes the measured film thickness being within a predetermined range allowable from an input target film thickness, and for example, denotes the measured film thickness being within ±1% from the input target film thickness. When it is determined that the measured film thickness is within the allowable range (operation S5; YES), the CPU 56 ends the processing.

When it is determined that the measured film thickness is not within the allowable range (operation S5; NO), the CPU 56 calculates the temperature (the optimal temperature) at which the film thickness is closest to the target film thickness and within a range in which the powers of the heaters 11 to 15 are not saturated, in operation S6.

For example, as shown in FIG. 10A, the CPU 56 calculates setting temperatures (at which the target film thickness is formed) of the respective heaters 11 to 15 disposed in ZONEs 1 to 5 inside the reaction tube 2 based on the film-thickness change model stored in the model memory unit 51 and the film thicknesses (shown in FIG. 9) of specified $SiO_2$ films. Here, the CPU 56 calculates powers of the heaters 11 to 15 at the respective setting temperatures based on the power change model stored in the model memory unit 51 and the calculated setting temperatures (shown in FIG. 10A) of the heaters 11 to 15.

Power P of each of the heaters 11 to 15 at the setting temperatures, for example, may be calculated as expressed in the following Equation;

$$(P)=(M)\times(\Delta T)+(P0)$$

where (M) denotes a model showing a relationship (shown in FIG. 5) between a temperature change and a power change of a heater, ($\Delta T$) denotes a difference (shown in FIG. 10B) between a temperature before changed and a temperature after changed, and (P0) denotes power of the heater shown in FIG. 8B. Also, the difference "($\Delta T$)" between before and after changed is calculated from the calculated setting temperature shown in FIG. 10A and the stored temperature shown in FIG. 8A.

The CPU 56 again calculates a setting temperature within a range corresponding to the following Equation when one of the calculated powers of the heaters 11 to 15 is saturated, namely, does not correspond to the following Equation;

$$0<(P)=(M)\times(\Delta T)+(P0)<100$$

In this example, as shown in FIG. 10C, since the power of the ZONE 5 (heater 15) is −4.5 and thus does not correspond to the Equation, as shown in FIG. 11A, the CPU 56 calculates setting temperatures (at which the target film thickness is formed) of the respective heaters 11 to 15 disposed in ZONEs 1 to 5 inside the reaction tube 2 based on the film-thickness change model stored in the model memory unit 51 and the film thicknesses (shown in FIG. 9) of the specified $SiO_2$ films. Furthermore, values shown in FIG. 11B are calculated by calculating powers of the heaters 11 to 15 at the respective setting temperatures. In this case, since all of the calculated powers of the heaters 11 to 15 are not saturated, temperatures shown in FIG. 11A becomes the optimal temperatures, respectively.

Subsequently, the CPU 56 updates the read temperatures of the respective ZONES 1 to 5 of the recipe to the calculated optimal temperatures in operation S7, and performs operations S3 to S5 again. That is, the CPU 56 controls the power controllers 16 to 20 such that the temperatures inside the reaction tube 2 become the respective optimal temperatures of FIG. 11A, namely, the temperature of the heater 11 becomes 581.4 degrees C., the temperature of the heater 12 becomes 580.4 degrees C., the temperature of the heater 13 becomes 580.4 degrees C., the temperature of the heater 14 becomes 580.6 degrees C., and the temperature of the heater 15 becomes 576.8 degrees C. Furthermore, the CPU 56 forms a $SiO_2$ film on a monitor wafer in operation S3, measures a film thickness of the formed $SiO_2$ film in operation S4, and determines whether the measured film thickness is within an allowable range in operation S5. In this example, as shown in FIG. 12, it can be seen that a difference between a specific film thickness and an input target film thickness (shown in FIG. 7) of a $SiO_2$ film is within 1% and is within the allowable range. Like this, even a manipulator having no knowledge or experience of a heat treatment apparatus or a process can form a $SiO_2$ film on a surface of a semiconductor wafer W according to a target. Also, when it is determined that the measured film thickness is not within the allowable range (operation S5; NO), the CPU 56 repeats operation S6, operation S7, and operations S3 to S5.

On the other hand, when it is determined that the measured film thickness is within the allowable range (operation S5; YES), and the CPU 56 ends the processing.

As described above, according to the embodiment, by the manipulator only inputting a target film thickness, the optimal temperature at which a film thickness is closest to the target film thickness can be calculated within a range, in which all of powers of the heaters 11 to 15 are not saturated. Accordingly, even a manipulator having no knowledge or experience of a heat treatment apparatus or a process can easily control a temperature for forming a $SiO_2$ film on a surface of a semiconductor wafer W according to a target.

Moreover, the present disclosure is not limited to the above-described embodiment, and may be variously modified or applied. Hereinafter, another embodiment applicable to the present disclosure will be described.

In the above-described embodiment, a case which forms the $SiO_2$ film using dichlorosilane and dinitrogen monoxide has been described as an example of the present disclosure, but the present disclosure may also be applied to a case which forms a SiN film using dichlorosilane and ammonia ($NH_3$).

In the above-described embodiment, a case of forming the $SiO_2$ film has been described as an example of the present disclosure, but the kind of processing is arbitrary. The present disclosure may be applied to various batch type heat treatment apparatuses such as chemical vapor deposition (CVD) apparatuses, oxidation apparatuses for forming a different kind of film.

In the above-described embodiment, a case in which the number of stages of heaters (number of zones) is five has been described as an example of the present disclosure, but the number of stages of heaters (number of zones) may be equal to or less than four or may be equal to or more than six. Also, the number of semiconductor wafers W extracted from each zone may be set arbitrarily.

In the above-described embodiment, the present disclosure has been described with the batch type heat treatment apparatus of a single-pipe structure as an example, but, as another example, the present disclosure may be applied to a batch type vertical heat treatment apparatus of a double-pipe structure in which the reaction tube 2 is configured with an inner pipe and an outer pipe. Also, the present disclosure is not limited to processing of a semiconductor wafer, and, as another example, the present disclosure may be applied to processing of an FPD substrate, a glass substrate, a PDP substrate, or the like.

The control unit 50 according to the embodiments of the present disclosure can be realized by a normal computer system, not an exclusive system. For example, the control unit 50 which executes the foregoing processes can be realized by, for example, installing a program for executing the foregoing processes in a general-purpose computer from a recording medium (flexible disk, CD-ROM, or the like) which stores the foregoing program.

The means of providing such programs are arbitrary. As explained above, the program can be provided through a predetermined recording medium, and can be provided through, for example, a communication line, a communication network, or a communication system. In this case, for example, the program may be placed on a bulletin board (BBS) of a communication network, and may be superimposed on a carrier wave to provide the program. The foregoing processes can be executed by starting the program provided in this manner and executing it under the control of an OS like other application programs.

According to the present disclosure, a temperature can be easily regulated.

The present disclosure is useful for a heat treatment system for heat-treating an object to be processed such as a semiconductor wafer.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A heat treatment system, comprising:
a heating unit configured to heat an inside of a processing chamber which receives a plurality of objects to be processed;
a heat treatment condition memory unit configured to store a heat treatment condition based on processing details, wherein the heat treatment condition includes a temperature inside the processing chamber heated by the heating unit;

a power change model memory unit configured to store a model showing a relationship between a temperature change inside the processing chamber and a power change of the heating unit;

a heat treatment change model memory unit configured to store a heat treatment change model showing a relationship between the temperature change inside the processing chamber and a change of a heat treatment result;

a heat treatment result reception unit configured to receive information on a heat treatment result in the heat treatment condition stored by the heat treatment condition memory unit and a targeted heat treatment result; and an optimal temperature calculation unit configured to calculate an optimal temperature corresponding to the targeted heat treatment result based on the heat treatment result in the heat treatment condition and the heat treatment change model stored in the heat treatment change model memory unit, wherein the heat treatment result is received by the heat treatment result reception unit, wherein the optimal temperature calculation unit calculates power of the heating unit at a corresponding temperature on the basis of the model stored in the power change model memory unit and the calculated temperature, and an optimal temperature is a temperature at which a heat treatment result is closest to the targeted heat treatment result within a range in which the calculated power of the heating unit is not saturated.

2. The heat treatment system of claim 1, wherein, the processing chamber is divided into a plurality of zones, in the heating unit, a temperature is set in each zone inside the processing chamber, the heat treatment condition stored in the heat treatment condition memory unit is set in each zone inside the processing chamber, the power change model stored in the power change model memory unit shows a relationship between a temperature change inside the processing chamber in each zones and a power change of the heating unit in each zone, the heat treatment change model stored in the heat treatment change model memory unit shows a relationship between the temperature change inside the processing chamber in each zone and a change of the heat treatment result for each zone, the heat treatment result reception unit receives information on a targeted heat treatment result for each zone, and the optimal temperature calculation unit calculates an optimal temperature of each zone.

3. The heat treatment system of claim 1, wherein, the processing details include a film formation processing, and the heat treatment result includes a film thickness of a thin film formed on an object to be processed.

* * * * *